United States Patent
Fujisaki

(10) Patent No.: US 8,677,197 B2
(45) Date of Patent: Mar. 18, 2014

(54) TEST APPARATUS

(75) Inventor: Kenichi Fujisaki, Saitama (JP)

(73) Assignee: Advantest Corporation, Tokyo (JP)

( * ) Notice: Subject to any disclaimer, the term of this patent is extended or adjusted under 35 U.S.C. 154(b) by 109 days.

(21) Appl. No.: 13/338,243

(22) Filed: Dec. 28, 2011

(65) Prior Publication Data

US 2012/0216086 A1 Aug. 23, 2012

(30) Foreign Application Priority Data

Feb. 23, 2011 (JP) ................................ 2011-036568

(51) Int. Cl.
*G11C 29/00* (2006.01)

(52) U.S. Cl.
USPC .......................................... 714/723; 714/719

(58) Field of Classification Search
USPC .......................................... 714/718, 719, 723
See application file for complete search history.

(56) References Cited

U.S. PATENT DOCUMENTS

| | | | | |
|---|---|---|---|---|
| 5,983,374 A * | 11/1999 | Todome et al. | ................ | 714/718 |
| 6,751,760 B2 * | 6/2004 | Tseng et al. | ................... | 714/710 |
| 6,851,078 B2 * | 2/2005 | Takano | ......................... | 714/718 |
| 6,910,155 B2 * | 6/2005 | Ku | .................................... | 714/30 |
| 7,240,257 B2 * | 7/2007 | Jeon et al. | ...................... | 714/723 |
| 7,441,166 B2 * | 10/2008 | Yamada et al. | ............... | 714/718 |
| 7,529,989 B2 * | 5/2009 | Fujisaki | ........................ | 714/723 |
| 7,769,558 B2 * | 8/2010 | Kappauf et al. | ............... | 702/124 |

FOREIGN PATENT DOCUMENTS

| | | | |
|---|---|---|---|
| JP | 3608694 B2 | 1/2005 | |
| JP | 4241157 B2 | 3/2009 | |
| KR | 10-2006-0135036 A | 12/2006 | |

OTHER PUBLICATIONS

Notice of Office Action for Korean Patent Appl. No. 10-2012-0001135, issued by the Korean Intellectual Property Office on Jul. 4, 2013.

* cited by examiner

*Primary Examiner* — James C Kerveros

(57) ABSTRACT

A test apparatus including a first buffer section and a second buffer section that each buffers fail data and address data; an address fail memory section that writes the fail data buffered in the first buffer section to an address of an internal memory indicated by the address data corresponding to the fail data, using an RMW process; and a control section that, in a state in which the fail data and address data output from the testing section are supplied to the first buffer section, when unused capacity of the first buffer section becomes less than or equal to a predetermined first threshold value, supplies the fail data and address data output from the testing section to the second buffer section instead of to the first buffer section.

15 Claims, 8 Drawing Sheets

TEST APPARATUS

BACKGROUND

1. Technical Field

The present invention relates to a test apparatus.

2. Related Art

A memory test apparatus includes a fail analysis memory section having therein an address fail memory (AFM) with the same address space as a memory under test. The memory test apparatus compares data read from the memory under test to an expected value, and writes fail data to the corresponding address of the AFM when the comparison result is a mismatch. The memory test apparatus performs a fail repair analysis for the memory under test, based on the fail data in the AFM.

Patent Document 1: Japanese Patent No. 3608694
Patent Document 2: Japanese Patent No. 4241157

The memory test apparatus performs the comparison between the data read from the memory under test and the expected value in units of cells (bits). In contrast, the AFM data is written and read in word units of 16 bits or 32 bits, for example.

Furthermore, there are cases in which the memory test apparatus tests the same cell a plurality of times. In this case, the memory test apparatus writes data indicating a fail to the AFM when this cell is judged to be defective. Even if this cell is judged to be non-defective in later testing, the memory test apparatus does not write data to the AFM indicating that the cell is non-defective, and therefore the information indicating that the cell is defective remains in the AFM.

The memory test apparatus writes fail data for a given cell (bit) at a given address of the memory under test to a bit corresponding to a corresponding address of the AFM, using a read-modify-write process. In this way, the memory test apparatus writes data in bit units to an AFM in which data is read and written word units. Therefore, once a fail judgment is recorded for a given bit, even if the memory test apparatus later judges that the corresponding cell is not defective during later testing, the memory test apparatus still stores a defective judgment for this bit.

However, the operation of writing data to a memory using a read-modify-write process requires an extremely long time. Therefore, when testing the memory under test at high speed, the writing of the fail data to the AFM is too slow.

To solve this problem, a memory test apparatus is known that includes a fail analysis memory section in which a plurality of AFMs are arranged in parallel corresponding to a single memory under test. This memory test apparatus sequentially selects one of the AFMs at a time in an interleaved manner and writes the fail data to the selected one AFM. This memory test apparatus can increase the speed at which the fail data is written from the perspective of the fail analysis memory section. Therefore, this memory test apparatus can prevent the writing of the fail data to the AFMs from being too slow.

However, with this memory test apparatus, a large number of AFMs must be mounted. Accordingly, with this memory test apparatus, the apparatus is large and the cost is high.

SUMMARY

To solve the above problems, according to a first aspect related to the innovations herein, provided is a test apparatus that tests a memory under test, comprising a testing section that outputs fail data indicating that a cell of the memory under test is defective and address data indicating an address of the cell; a first buffer section that buffers the fail data and the address data; a second buffer section that buffers the fail data and the address data; an address fail memory section that writes the fail data buffered in the first buffer section to an address of an internal memory indicated by the address data corresponding to the fail data, using a read-modify-write process; a switching section that switches whether the fail data and address data output from the testing section or the fail data and address data buffered in the second buffer section are supplied to the first buffer section; and a control section that, in a state in which the fail data and address data output from the testing section are supplied to the first buffer section, when unused capacity of the first buffer section becomes less than or equal to a predetermined first threshold value, supplies the fail data and address data output from the testing section to the second buffer section instead of to the first buffer section.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
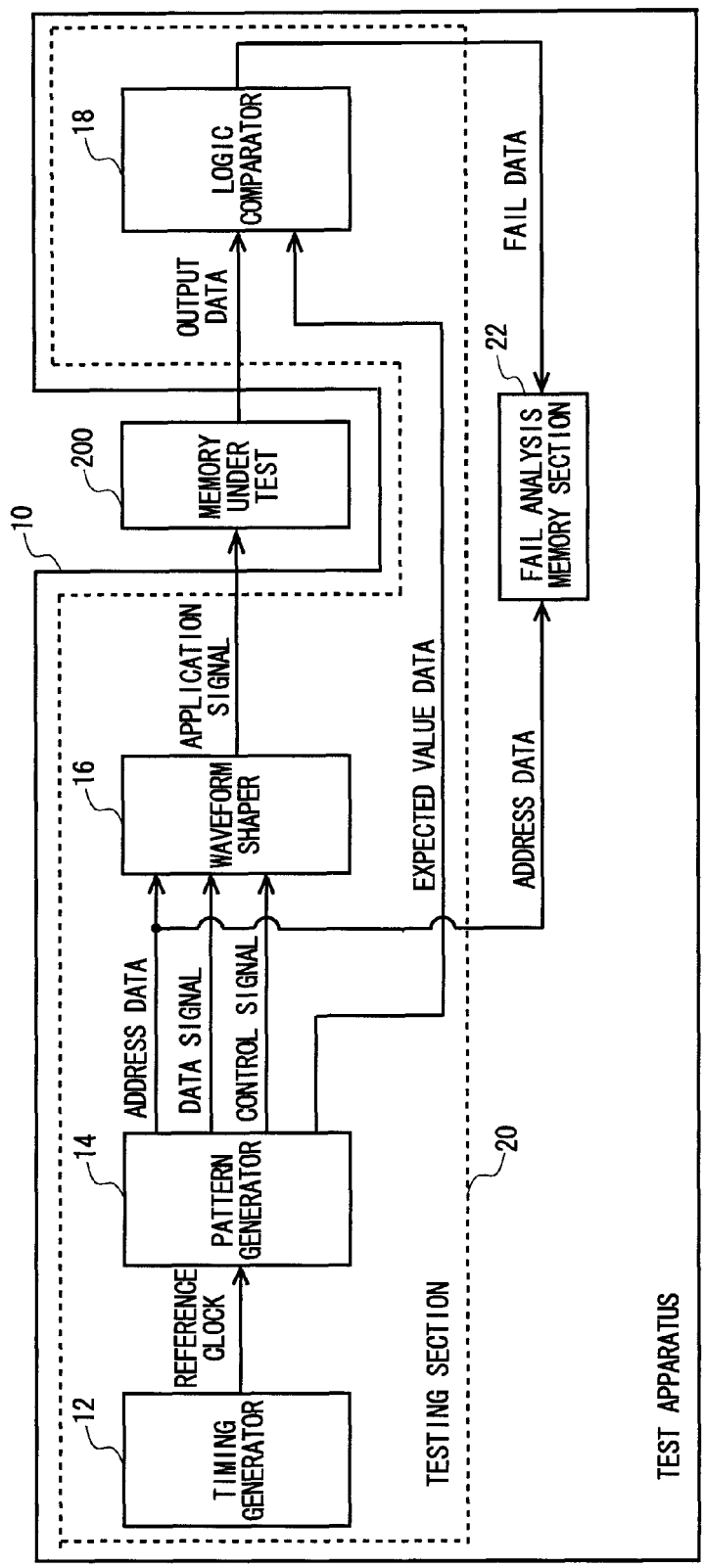
FIG. 1 shows a configuration of a test apparatus 10 according to an embodiment of the present invention, along with a memory under test 200.

FIG. 1 shows a configuration of a test apparatus 10 according to an embodiment of the present invention, along with a memory under test 200. The test apparatus 10 of the present invention detects defective cells by testing the memory under test 200. Furthermore, the test apparatus 10 performs a repair analysis for making the memory under test 200 an acceptable article, by electrically replacing address lines including defective cells with spare lines.

The test apparatus 10 includes a testing section 20 and a fail analysis memory section 22. The testing section 20 tests the memory under test 200 and outputs fail data indicating that a cell of the memory under test 200 is defective and address data indicating the address of the cell.

The testing section 20 includes a timing generator 12, a pattern generator 14, a waveform shaper 16, and a logical comparator 18. The timing generator 12 generates a reference clock and supplies the reference clock to the pattern generator 14. The pattern generator 14 generates address data, a data signal, and a control signal to be supplied to the memory under test 200, based on the reference clock, and supplies the address data, data signal, and control signal to the waveform shaper 16. Furthermore, the pattern generator 14 generates expected value data that is compared to the output data of the memory under test 200, and supplies the expected value data to the logical comparator 18.

The waveform shaper 16 forms an application signal based on the address data, the data signal, and the control signal, and supplies the application signal to the memory under test 200. The logical comparator 18 compares the expected value data to the output data output by the memory under test 200, for each cell (bit) of the memory under test 200. The logical comparator 18 outputs fail data when the output data does not match the expected value data. In the present embodiment, the fail data has a value of 1 when the output data does not match the expected value data, i.e. when there is a fail, and a value of 0 when the output data does match the expected value data, i.e. when there is a pass.

The fail analysis memory section 22 receives the address data and the fail data output from the testing section 20. The fail analysis memory section 22 stores the fail data at an address corresponding to the address of the defective cell of the memory under test 200. In this way, after testing of the memory under test 200 is completed, the fail analysis memory section 22 can store information indicating whether each cell of the memory under test 200 is a defective cell or an acceptable cell.

Figure 2:
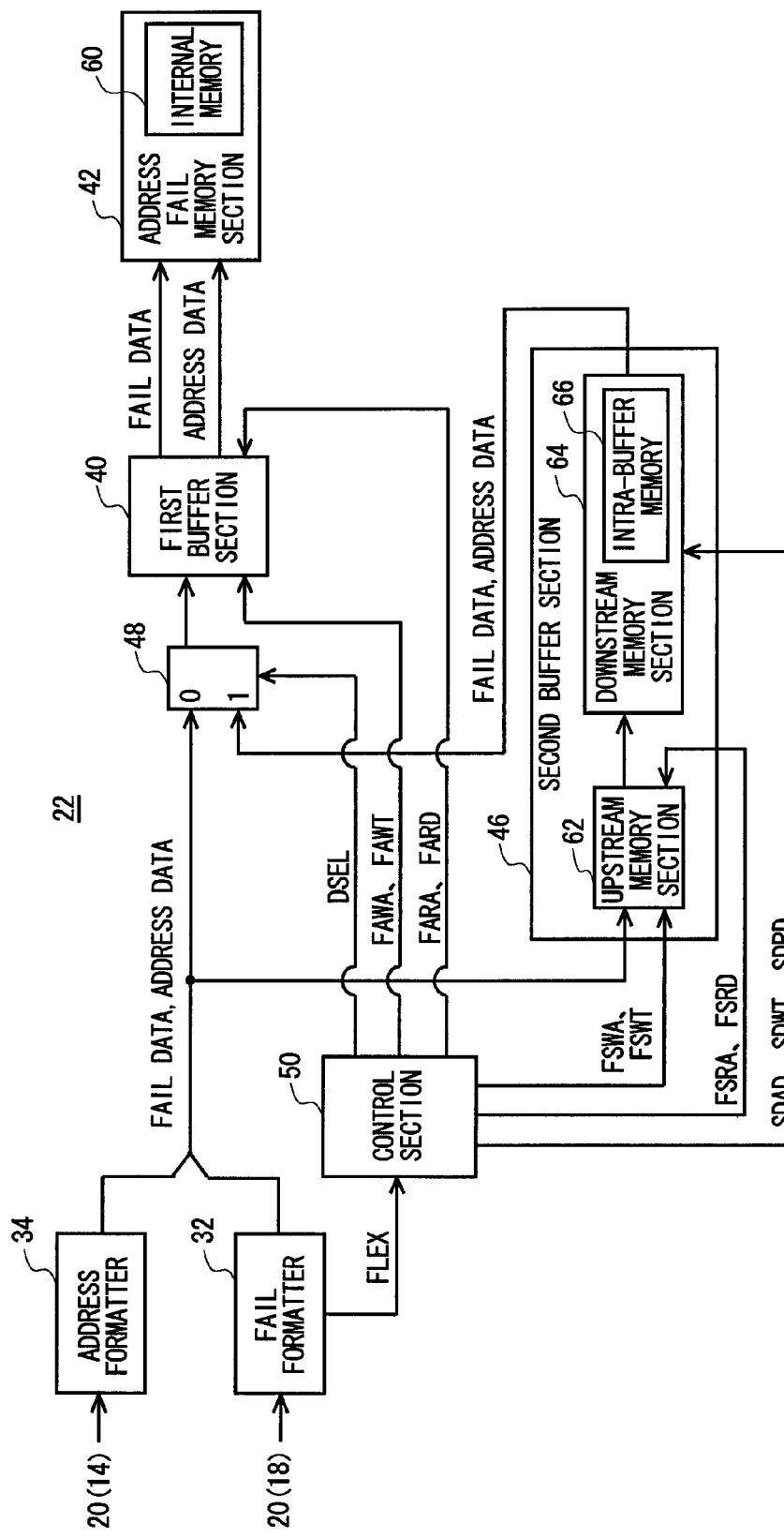
FIG. 2 shows a configuration of the fail analysis memory section 22 according to the present embodiment.

FIG. 2 shows a configuration of the fail analysis memory section 22 according to the present embodiment. The fail analysis memory section 22 includes a fail formatter 32, an address formatter 34, a first buffer section 40, an address fail memory section 42, a second buffer section 46, a switching section 48, and a control section 50.

The fail formatter 32 receives, in address units of the memory under test 200, the fail data output from the logical comparator 18 of the testing section 20. The fail formatter 32 converts the fail data in address units of the memory under test 200 into a bit format corresponding to words, which may be 16 bits or 32 bits, for example, of the address fail memory section 42.

The fail formatter 32 supplies the second buffer section 46 and the first buffer section 40 with the fail data in word units that has the converted format. In the present embodiment, data that includes a value of 1, which is the value representing a fail, for at least one bit in the data output from the fail formatter 32 is referred to as fail data.

The fail formatter 32 supplies the control section 50 with a FLEX signal, in addition to outputting the fail data. In the present embodiment, the fail formatter 32 outputs the FLEX signal with a value of 1 in a case where not all of the bits in the output data have a value of 0, i.e. when the output data is fail data, and outputs the FLEX signal with a value of 0 when data differing from the above data is output.

The address formatter 34 receives the address data output from the pattern generator 14 of the testing section 20. The address formatter 34 converts the received address data into a data format indicating an address of the address fail memory section 42. The address formatter 34 supplies the first buffer section 40 and the second buffer section 46 with the format-converted address data, in association with the fail data output from the address formatter 34.

The first buffer section 40 receives either a set of fail data and address data output from the testing section 20 (the fail data and the address data output from the fail formatter 32 and the address formatter 34 in the present embodiment) or a set of the fail data and address data buffered in the second buffer section 46. The first buffer section 40 buffers the received fail data and address data. The first buffer section 40 may be a FIFO (First In First Out) memory, for example.

The testing section 20 can change the period of the test cycle during testing. Furthermore, if the address fail memory section 42 downstream from the first buffer section 40 uses a clock-synchronized memory such as an SDRAM (Synchronous Dynamic Random Access Memory), the address fail memory section 42 must operate with a constant period. Therefore, since the period of the test cycle generated by the testing section 20 is not the same as the operating period of the address fail memory section 42, the inclusion of the first buffer section 40 enables the difference between the period of the test cycle and the period of the operation clock of the address fail memory section 42 to be absorbed.

The address fail memory section 42 includes an internal memory 60 having an address space corresponding to the memory under test 200. The internal memory 60 may be an SDRAM-type random access memory, such as a DDR (Double-Data-Rate)2 SDRAM or a DDR3 SDRAM.

The address fail memory section 42 receives the fail data buffered in the first buffer section 40, and writes this fail data to the internal memory 60. In this case, the address fail memory section 42 writes the received fail data to an address indicated by the address data corresponding to the fail data in the internal memory 60.

Furthermore, in this case, the address fail memory section 42 writes the received fail data to an address of the address data received by the internal memory 60 using a read-modify-write process. Specifically, the address fail memory section 42 reads one or more words of previously written data from the corresponding address of the internal memory 60, calculates the logical sum of each bit of the fail data and corresponding bits of the read data, and writes the one or more words of data resulting from the logical sum calculation back to the corresponding address of the internal memory 60.

Prior to testing, the internal memory 60 is initialized to have a value of 0 for every piece of stored data. Accordingly, when testing is completed for all of the addresses of the memory under test 200 and writing of all fail data and address data buffered in the second buffer section 46 to the internal memory 60 is completed, the internal memory 60 can store data indicating which cells at which addresses of the memory under test 200 are defective.

The second buffer section 46 receives the fail data and address data output by the testing section 20 (the fail data and address data output by the fail formatter 32 and the address formatter 34 in the present embodiment). The second buffer section 46 buffers the received fail data and address data. The fail data and address data buffered by the second buffer section 46 are transmitted to the first buffer section 40 under the control of the control section 50.

The second buffer section 46 includes an upstream memory section 62 and a downstream memory section 64. If the downstream memory section 64 uses a clock-synchronized memory such as an SDRAM therein, the upstream memory section 62 may be a FIFO memory that buffers the fail data and address data output from the testing section 20. As a result, the upstream memory section 62 can absorb the difference between the period of the test cycle and the period of the operation clock of the downstream memory section 64.

The downstream memory section 64 includes an intra-buffer memory 66, which is a random access memory. The intra-buffer memory 66 may be an SDRAM-type random access memory such as a DDR2 SDRAM or a DDR3 SDRAM.

The downstream memory section 64 sequentially inputs the buffered fail data and the address data into the upstream memory section 62, and writes this information to the intra-buffer memory 66 using a burst write process. In other words, the downstream memory section 64 sequentially inputs the buffered fail data and the address data into the upstream memory section 62 and writes this information to the intra-buffer memory 66 without using the read-modify-write process.

The downstream memory section 64 does not write the data to the intra-buffer memory 66 using a read-modify-write process, and therefore the data can be written to the intra-buffer memory 66 in a shorter time than needed to write the data to the internal memory 60 in the address fail memory section 42. The fail data and address data written to the intra-buffer memory 66 are supplied to the first buffer section 40 via the switching section 48, under the control of the control section 50.

Under the control of the control section 50, the switching section 48 switches between supplying the first buffer section 40 with the fail data and address data output by the testing section 20, i.e. the fail data and address data output by the fail formatter 32 and the address formatter 34, and supplying the first buffer section 40 with the fail data and address data buffered in the second buffer section 46. The switching section 48 may be a multiplexer, for example.

The control section 50 controls operation of the first buffer section 40, the address fail memory section 42, the second buffer section 46, and the switching section 48.

More specifically, the control section 50 supplies the first buffer section 40 with a first write command (FAWT) and a first write address (FAWA). Upon receiving the first write command (FAWT) from the control section 50, the first buffer section 40 stores the fail data and address data received via the switching section 48 at the address indicated by the first write address (FAWA).

The control section 50 supplies the first buffer section 40 with a first read command (FARD) and a first read address (FARA). Upon receiving the first read command (FARD) from the control section 50, the first buffer section 40 outputs the fail data and address data stored at the first read address (FARA). In this case, the address fail memory section 42 acquires the fail data and address data output from the first buffer section 40 and writes the acquired fail data to the address in the internal memory 60 indicated by the acquired address data, using a read-modify-write process.

As an example, the control section 50 may calculate the amount of effective fail data, which is the fail data and address data that is buffered by the first buffer section 40 but has yet to be written to the address fail memory section 42, by subtracting the value of the first read address (FARA) from the value of the first write address (FAWA). Furthermore, the control section 50 calculates the remaining capacity of the first buffer section 40 by subtracting the amount of effective fail data buffered by the first buffer section 40 from the total capacity of the first buffer section 40.

The control section 50 supplies the upstream memory section 62 of the second buffer section 46 with a second write command (FSWT) and a second write address (FSWA). Upon receiving the second write command (FSWT) from the control section 50, the upstream memory section 62 of the second buffer section 46 stores the received fail data and address data at the address indicated by the second write address (FSWA).

The control section 50 supplies the upstream memory section 62 of the second buffer section 46 with a second read command (FSRD) and a second read address (FSRA). Upon receiving the second read command (FSRD) from the control section 50, the upstream memory section 62 of the second buffer section 46 outputs the fail data and address data stored at the second read address (FSRA). When outputting the fail data and address data from the second buffer section 46, in order to perform the burst write process in the downstream memory section 64, the control section 50 causes a designated number of pieces of fail data and address data to be output in series.

The control section 50 supplies the downstream memory section 64 of the second buffer section 46 with a third write command (SDWT) and address (SDAD) or a third read command (SDRD) and address (SDAD). In response to receiving the third write command (SDWT) and the address (SDAD) from the control section 50, the downstream memory section 64 writes the designated number of pieces of fail data and address data sequentially output in series by the upstream memory section 62 to a designated range from the address of the intra-buffer memory 66 indicated by the address (SDAD), using a burst write process.

In response to receiving the third read command (SDRD) and the address (SDAD) from the control section 50, the downstream memory section 64 reads the fail data and address data in a designated range from the address of the intra-buffer memory 66 indicated by the address (SDAD), using a burst read process, and outputs the read data in synchronization with the operation clock of the testing section 20. The fail data and address data output from the downstream memory section 64 are supplied to the first buffer section 40 via the switching section 48.

As an example, the control section 50 may generate the address to be supplied to the downstream memory section 64 when writing data to the intra-buffer memory 66 using an internal write address counter. As another example, the control section 50 may generate the address to be supplied to the downstream memory section 64 when reading data from the intra-buffer memory 66 using an internal read address counter.

The control section 50 switches between outputting the read address counter value and outputting the write address counter value as the address (SDAD), according to the content of the command supplied to the downstream memory section 64. The control section 50 manages the region to be written to or read from in the intra-buffer memory 66, based on the read address counter value and the write address counter value.

The control section 50 also manages the unused region of the downstream memory section 64. When the downstream memory section 64 of the second buffer section 46 overflows, the control section 50 sets an overflow flag in an internal register. After testing is finished, the computer controlling the test apparatus 10, for example, can know whether an overflow occurred by reading the value in this register.

The control section 50 supplies a switch command (DSEL) to the switching section 48. When the switch command (DSEL) supplied from the control section 50 has a value of 0, for example, the switching section 48 supplies the first buffer section 40 with the fail data and address data output from the testing section 20, which is the fail data and address data from the fail formatter 32 and the address formatter 34 in the present embodiment. When the switch command (DSEL)

supplied from the control section 50 has a value of 1, for example, the switching section 48 supplies the first buffer section 40 with the fail data and address data output from the internal memory 60 of the second buffer section 46.

The control section 50 sets the fail analysis memory section 22 to be in one of a first state, a second state, and a third state. The control section 50 then switches the transmission path of the fail data and address data according to the set state.

Figure 3:
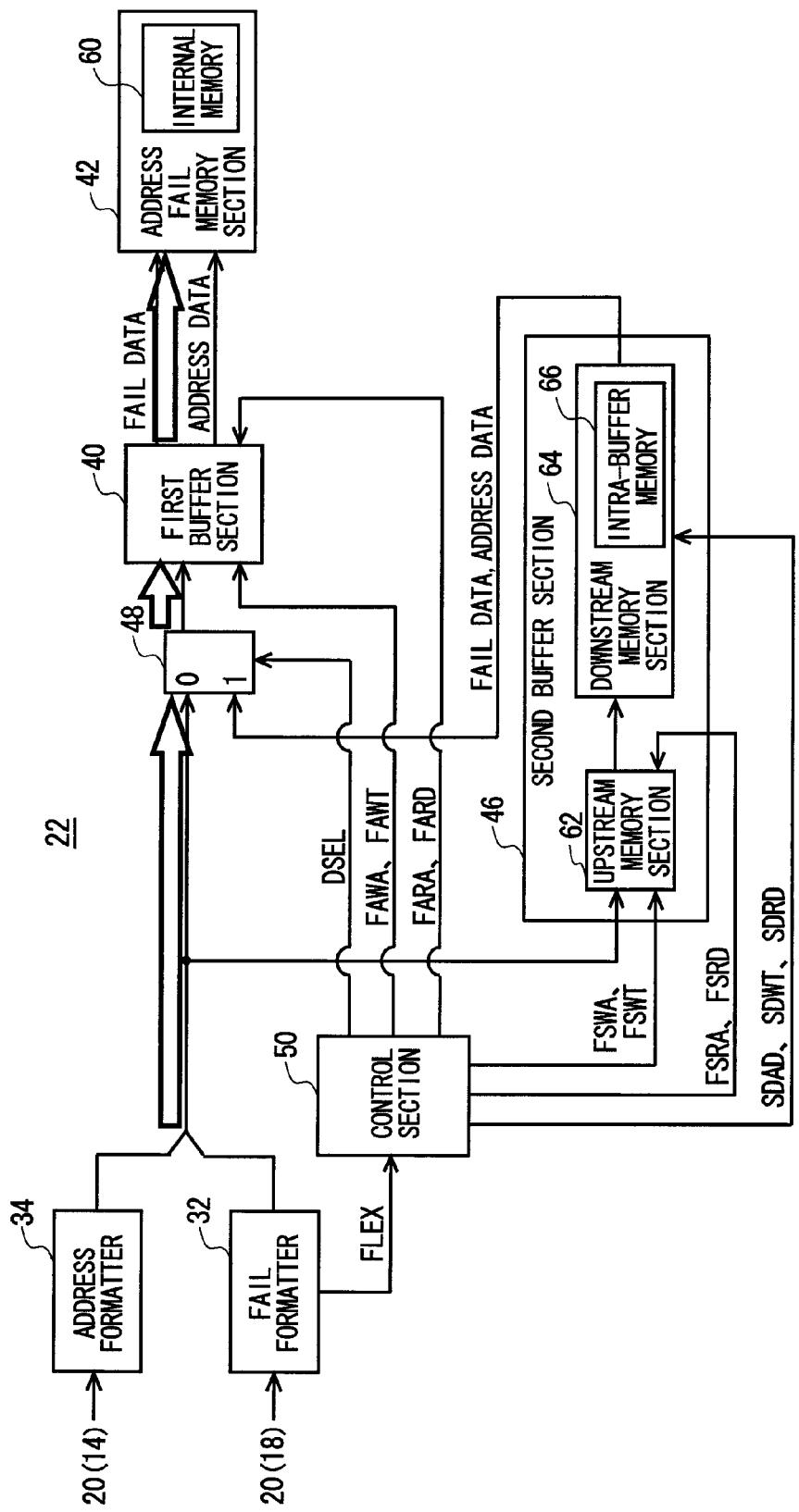
FIG. 3 shows the flow of data in the first state of the fail analysis memory section 22 according to the present embodiment.

FIG. 3 shows the flow of data in the first state of the fail analysis memory section 22 according to the present embodiment. In the first state, the control section 50 sets the switch command (DSEL) to have a value of 0. As a result, the switching section 48 can supply the first buffer section 40 with the fail data and address data output from the testing section 20, i.e. the fail data and address data output from the fail formatter 32 and the address formatter 34.

In the first state, each time a FLEX signal is supplied from the fail formatter 32, the control section 50 supplies the first buffer section 40 with a first write address (FAWA) and a first write command (FAWT). The control section 50 increments the first write address (FAWA) by 1 after data is written to the first buffer section 40. As a result, in the first state, the first buffer section 40 can sequentially store the pieces of fail data and address data output sequentially from the testing section 20, while incrementing the address by 1 for each piece of data. In this way, while in the first state, the fail analysis memory section 22 can supply the first buffer section 40 with the fail data and the address data output from the testing section 20.

Furthermore, in the first state, on a condition that fail data and address data not yet sent to the address fail memory section 42 is stored in the first buffer section 40, the control section 50 supplies the first buffer section 40 with a first read address (FARA) and a first read command (FARD) each time the address fail memory section 42 is capable of writing. After the address fail memory section 42 receives data from the first buffer section 40, the control section 50 increments the first read address (FARA) by 1. As a result, the first buffer section 40 can sequentially output the stored fail data and address data while incrementing the address by 1 for each piece of data.

In response to fail data and address data being output from the first buffer section 40, the address fail memory section 42 acquires the output fail data and address data. The address fail memory section 42 writes the acquired fail data to the address in the internal memory 60 indicated by the acquired address data, using a read-modify-write process. In this way, in the first state, the fail analysis memory section 22 can output the fail data and address data form the first buffer section 40 and store the fail data in the address fail memory section 42.

Figure 4:
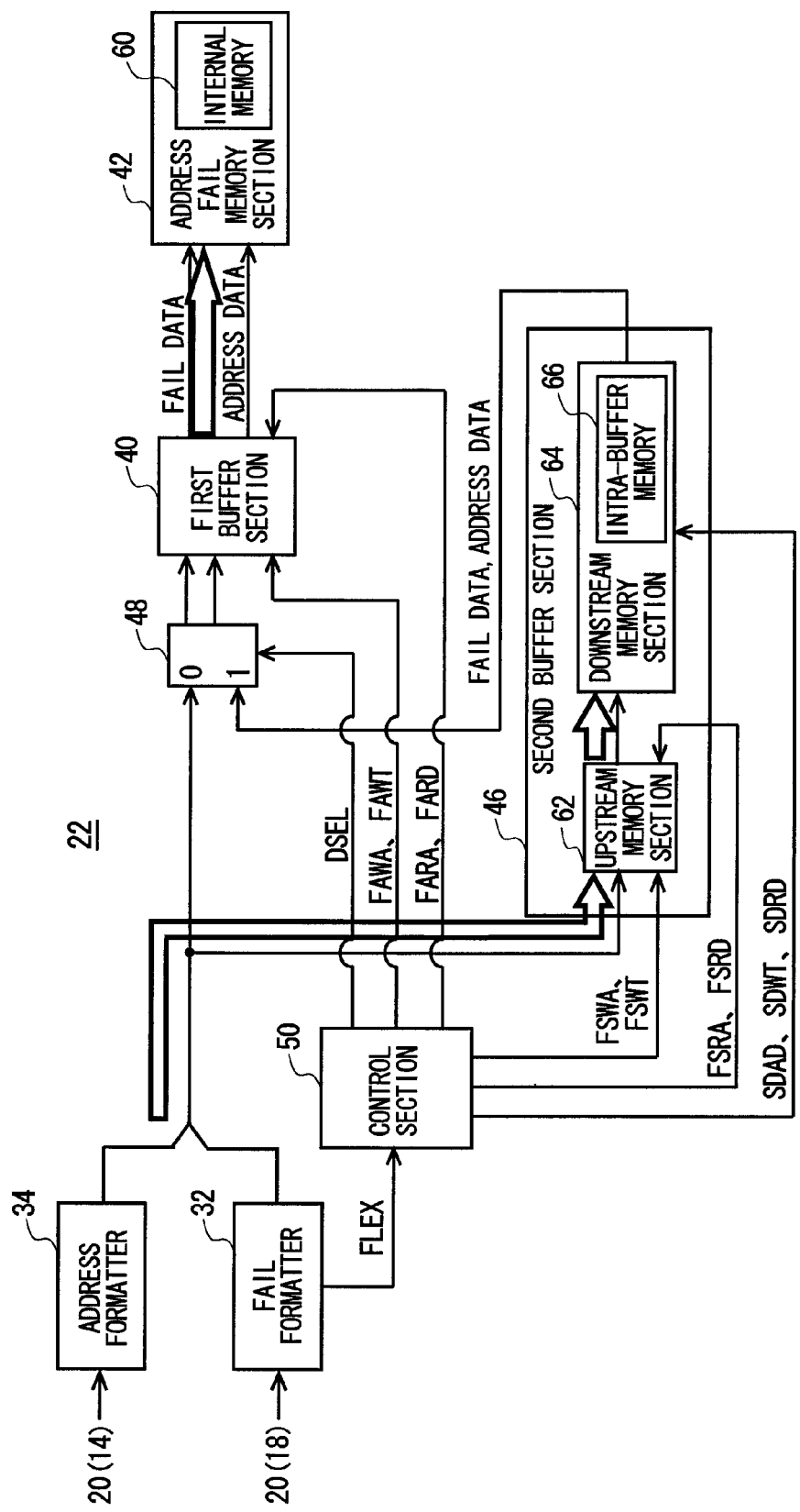
FIG. 4 shows the flow of data in the second state of the fail analysis memory section 22 according to the present embodiment.

FIG. 4 shows the flow of data in the second state of the fail analysis memory section 22 according to the present embodiment. In the second state, each time a FLEX signal is supplied from the fail formatter 32, the control section 50 supplies the upstream memory section 62 of the second buffer section 46 with a second write address (FSWA) and a second write command (FSWT). After data is written to the upstream memory section 62, the control section 50 increments the second write address (FSWA) by 1. As a result, in the second state, the upstream memory section 62 of the second buffer section 46 can sequentially store the fail data and address data output sequentially from the testing section 20, while incrementing the address by 1 for each piece of data.

In the second state, the control section 50 supplies the upstream memory section 62 of the second buffer section 46 with a second read address (FSRA) and a second read command (FSRD) each time the downstream memory section 64 is capable of writing. When a second read address (FSRA) and a second read command (FSRD) are supplied, the upstream memory section 62 outputs the fail data and address data stored at the second read address (FSRA). The control section 50 then increments the second read address (FSRA) by 1. In this way, the upstream memory section 62 of the second buffer section 46 can sequentially output the stored fail data and address data in series, while incrementing the address by 1 for each piece of data.

Furthermore, in the second state, on a condition that the amount of fail data and address data stored in the upstream memory section 62 of the second buffer section 46 is greater than or equal to a predetermined amount, the control section 50 supplies the downstream memory section 64 with a third write command (SDWT) indicating a burst write process and an address (SDAD) indicating a start address for the burst write process. Upon receiving the third write command (SDWT) and the address (SDAD), the downstream memory section 64 sequentially writes fail data and address data output from the upstream memory section 62 of the second buffer section 46 over the data in a designated range from the start address in the intra-buffer memory 66 indicated by the address (SDAD). In this way, the downstream memory section 64 can write the fail data and address data buffered in the upstream memory section 62 to the intra-buffer memory 66 using a burst write process.

In this way, in the second state, the fail analysis memory section 22 can write the fail data and address data output from the testing section 20 to the second buffer section 46.

Furthermore, in the second state, the control section 50 supplies the first buffer section 40 with a first read address (FARA) and a first read command (FARD), in the same manner as in the first state. The address fail memory section 42 also performs processing in the same manner as in the first state. Therefore, in the second state, the fail analysis memory section 22 can output the fail data and address data from the first buffer section 40 and can store the fail data in the address fail memory section 42.

Figure 5:
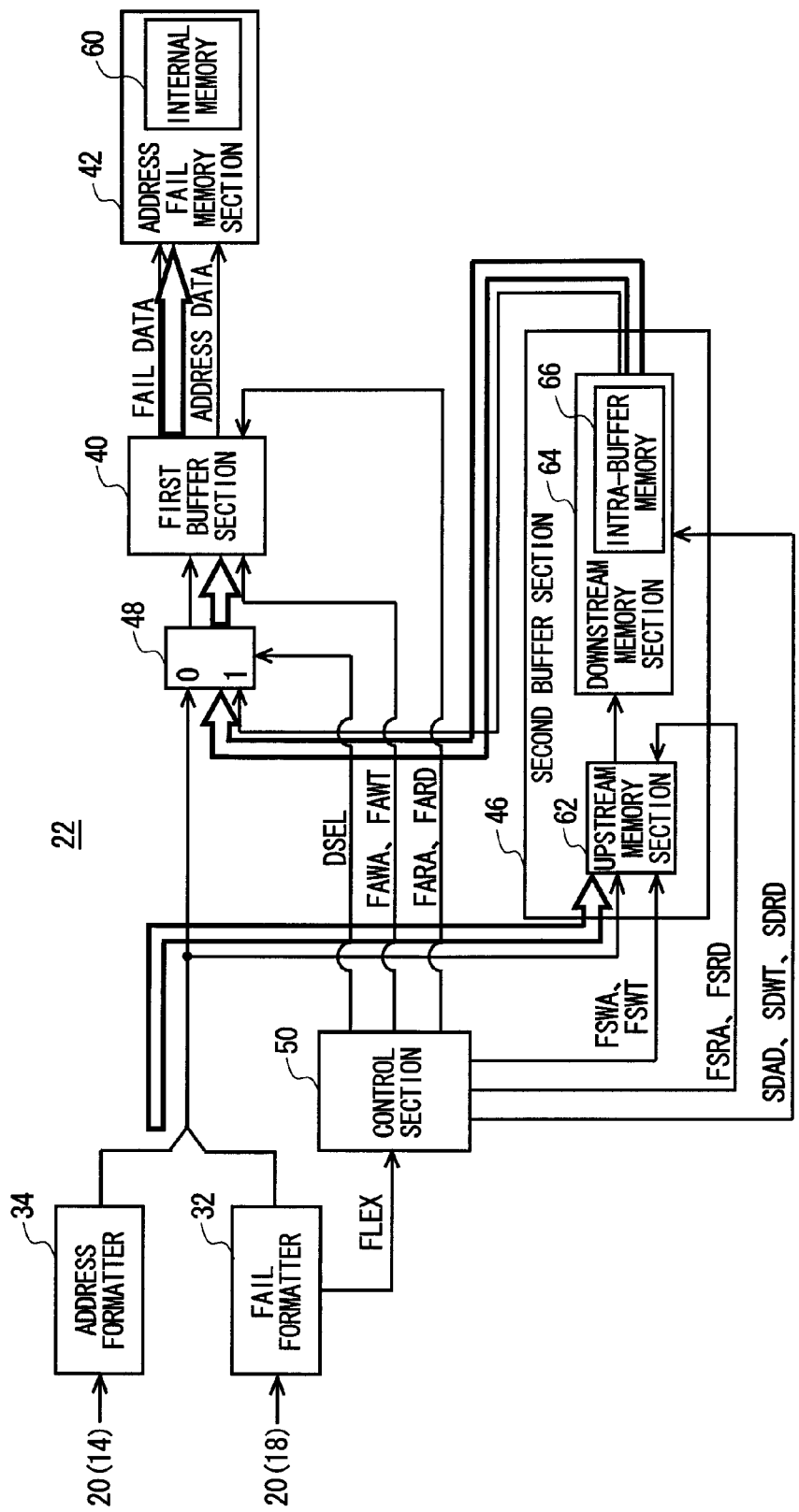
FIG. 5 shows the flow of data in the third state of the fail analysis memory section 22 according to the present embodiment.

FIG. 5 shows the flow of data in the third state of the fail analysis memory section 22 according to the present embodiment. In the third state, the control section 50 sets the switch command (DSEL) to have a value of 1. As a result, the switching section 48 can supply the first buffer section 40 with the fail data and address data output from the downstream memory section 64 of the second buffer section 46.

In the third state, on a condition that the amount of fail data and address data stored in the downstream memory section 64 of the second buffer section 46 is greater than or equal to a predetermined amount, the control section 50 supplies the downstream memory section 64 with a third read command (SDRD) indicating a burst read process and an address (SDAD) indicating a start address for the burst write process. Upon receiving the third read command (SDRD) and the address (SDAD), the downstream memory section 64 sequentially reads the fail data and address data in series in a designated range from the start address in the intra-buffer memory 66 indicated by the address (SDAD). In this way, the downstream memory section 64 can read the fail data and address data stored in the intra-buffer memory 66 using a burst read process.

In the third state, the control section 50 supplies the first buffer section 40 with a first write address (FAWA) and a first write command (FAWT) each time the fail data and address data for one address is output from the downstream memory section 64. The control section 50 increments the first write address (FAWA) after data is written to the first buffer section 40. In this way, in the third state, the first buffer section 40 can sequentially store the fail data and address data output sequentially and in series from the downstream memory section 64, while incrementing the address by one for each piece of data, using a burst read process.

In the third state, each time a FLEX signal is supplied from the fail formatter 32, the control section 50 supplies the upstream memory section 62 of the second buffer section 46 with a second write address (FSWA) and a second write command (FSWT). After data is written to the upstream memory section 62, the control section 50 increments the second write address (FSWA) by 1. As a result, in the third state, the upstream memory section 62 of the second buffer section 46 can sequentially store the fail data and address data output sequentially from the testing section 20, while incrementing the address by 1 for each piece of data.

In this way, in the third state, the fail analysis memory section 22 can supply the first buffer section 40 with the fail data and address data buffered in the second buffer section 46 and can also write the fail data and address data output from the testing section 20 to the second buffer section 46.

Furthermore, in the third state, the control section 50 supplies the first buffer section 40 with a first read address (FARA) and a first read command (FARD), in the same manner as in the first state. The address fail memory section 42 also performs processing in the same manner as in the first state. Therefore, in the third state, the fail analysis memory section 22 can output the fail data and address data from the first buffer section 40 and can store the fail data in the address fail memory section 42.

Furthermore, in the third state, the control section 50 continuously outputs data from the upstream memory section 62 and continuously writes data using a burst write process performed by the downstream memory section 64, in the same manner as in the second state. Before the testing is finished, the control section 50 gives more priority to executing the process of transmitting data from the upstream memory section 62 to the downstream memory section 64 than to executing the process for transmitting the data from the downstream memory section 64 to the first buffer section 40. As a result, the control section 50 can prevent the upstream memory section 62 from overflowing.

After testing is completed, the control section 50 gives more priority to executing the process of transmitting data from the downstream memory section 64 to the first buffer section 40 than to executing the process for transmitting the data from the upstream memory section 62 to the downstream memory section 64. As a result, the control section 50 can decrease the time needed to write all of the pieces of fail data to the address fail memory section 42.

Figure 6:
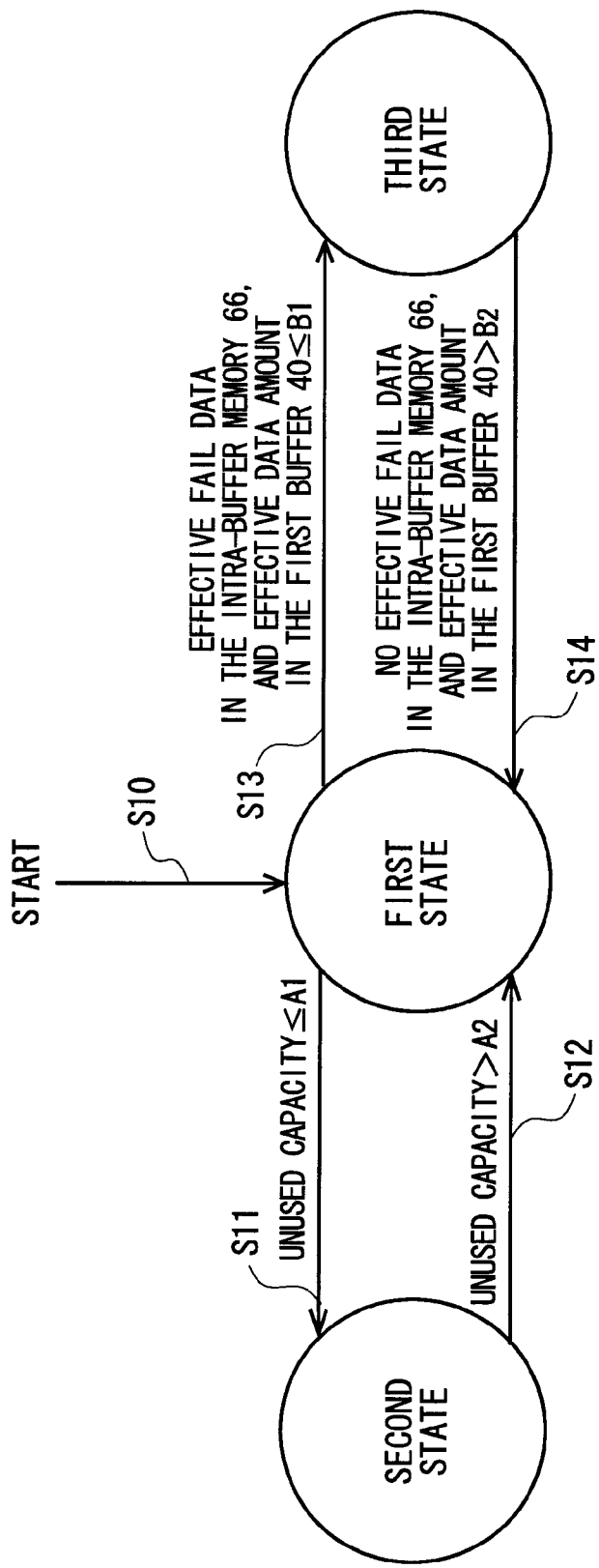
FIG. 6 shows transition conditions for the state of the fail analysis memory section 22 according to the present embodiment.

FIG. 6 shows transition conditions for the state of the fail analysis memory section 22 according to the present embodiment. Before testing is begun, the control section 50 clears the address fail memory section 42 by writing a value of 0 for every address. Furthermore, before testing is begun, the control section 50 sets the first write address (FAWA), the first read address (FARA), the second write address (FSWA), and the second read address (FSRA) to an initial value, e.g. a value of 0.

Next, when the testing section 20 begins testing, the control section 50 transitions the fail analysis memory section 22 to the first state (S10). Specifically, when the testing begins, the control section 50 supplies the first buffer section 40 with the fail data and address data output from the testing section 20. As a result, the control section 50 can buffer the fail data and address data output from the testing section 20 in the first buffer section 40.

In the first state, if the writing rate at which the address fail memory section 42 writes the fail data is lower than the data rate of the fail data and address data output from the testing section 20, the unused capacity of the first buffer section 40 gradually decreases. Accordingly, if this state continues, the first buffer section 40 will overflow.

Therefore, during the state in which the control section 50 causes the fail data and address data output from the testing section 20 to be written to the first buffer section 40, i.e. during the first state, when the unused capacity of the first buffer section 40 becomes less than or equal to a predetermined first threshold value ($A_1$), the control section 50 transitions the fail analysis memory section 22 to the second state (S11). In other words, in the first state, when the unused capacity of the first buffer section 40 becomes less than or equal to a predetermined first threshold value ($A_1$), the control section 50 causes the fail data and address data output from the testing section 20 to be written to the second buffer section 46 instead of to the first buffer section 40.

At the same time, the control section 50 stops the writing of the fail data and address data output from the testing section 20 to the first buffer section 40. Accordingly, the fail analysis memory section 22 can prevent overflow of the first buffer section 40 by transitioning from the first state to the second state.

In the present embodiment, the second buffer section 46 includes the upstream memory section 62 and the downstream memory section 64. The fail data and address data output from the testing section 20 is first buffered in the upstream memory section 62, and then transmitted to the intra-buffer memory 66 in the downstream memory section 64. The downstream memory section 64 writes the data buffered in the upstream memory section 62 to the intra-buffer memory 66 using a burst write process, and does not use a read-modify-write process. Accordingly, the process of writing the data buffered in the upstream memory section 62 to the downstream memory section 64 is performed faster than the process for writing the data buffered in the first buffer section 40 to the address fail memory section 42.

The second buffer section 46 is designed and controlled to prevent overflow of the intra-buffer memory 66 in the downstream memory section 64 and the upstream memory section 62. The upstream memory section 62 is a FIFO memory, in the same manner as the first buffer section 40, and therefore prevents overflow by reading the fail data and address data with a speed greater than the speed at which the fail data and address data is written, which is at most the period of the test cycle, and performing the burst write process to the intra-buffer memory 66 as described above. Furthermore, the intra-buffer memory 66 can decrease the chances of an overflow by using a high capacity memory such as an SDRAM. Furthermore, if the third state can be transitioned to during testing, the control section 50 can transmit the fail data and address data from the intra-buffer memory 66 to the first buffer section 40. In this case, the control section 50 can write the resulting new fail data and address data to the intra-buffer memory 66, and can therefore decrease the chances of the intra-buffer memory 66 overflowing.

Next, in a state where the fail data and address data is written from the testing section 20 to the second buffer section 46, i.e. the second state, when the unused capacity of the first buffer section 40 becomes greater than a second threshold value ($A_2$) that is greater than or equal to the first threshold value ($A_1$), the control section 50 transitions the fail analysis memory section 22 to the first state (S12). In other words, in the second state, when the remaining capacity of the first buffer section 40 becomes greater than the second threshold value ($A_2$), the control section 50 causes the fail data and address data output from the testing section 20 to be written to the first buffer section 40 instead of to the second buffer section 46.

In this way, the control section 50 can return to a state in which the fail data and address data from the testing section 20 are buffered in the first buffer section 40. After testing is completed, if effective fail data that has not yet been written to the address fail memory section 42 remains in the intra-buffer memory 66 of the second buffer section 46, it is necessary to transition to the third state to transmit this fail data to the first buffer section 40 and write this fail data in the address fail memory section 42. Therefore, when there is a large amount of unused capacity in the first buffer section 40, the control section 50 can decrease the number of pieces of effective fail data in the second buffer section 46 after testing by transitioning from the second state to the first state and writing the fail data to the first buffer section 40.

Next, in the first state, when the data rate of the fail data and address data output from the testing section 20 is less than the rate at which the fail data is written in the address fail memory section 42, the amount of remaining effective fail data stored in the first buffer section 40 gradually decreases. Accordingly, when this state continues, the effective fail data is removed from the first buffer section 40, and the writing of the fail data to the address fail memory section 42 stops. However, when there is effective fail data in the intra-buffer memory 66 before all of the effective fail data is removed from the first buffer section 40, before transitioning to the third state and stopping, the effective fail data can be written to the address fail memory section 42 without stopping by reading the effective fail data from the intra-buffer memory 66 and writing this fail data to the first buffer section 40.

Therefore, the control section 50 transitions the fail analysis memory section 22 from the state in which the fail data and address data output from the testing section 20 are written to the first buffer section 40, i.e. the first state, to the third state (S13). The conditions for transitioning from the first state to the third state are that, while in the first state, the intra-buffer memory 66 contains effective fail data and the amount of effective fail data in the first buffer section 40 is less than a preset third threshold value ($B_1$). When the third state is transitioned to, the control section 50 supplies the first buffer section 40 with the effective fail data buffered in the second buffer section 46 and writes the fail data and address data output from the testing section 20 to the second buffer section 46.

As a result, the control section 50 can cause the effective fail data that has yet to be written to the address fail memory section 42 from the second buffer section 46 to be output and buffered in the first buffer section 40. Accordingly, as a result of transitioning from the first state to the third state, the fail analysis memory section 22 stops the writing of fail data to the address fail memory section 42, and can therefore avoid the increased time needed to finish the writing of fail data to the address fail memory section 42.

The control section 50 transitions the fail analysis memory section 22 from a state in which the fail data and address data buffered in the second buffer section 46 are supplied to the first buffer section 40, i.e. the third state, to a first state (S14). The conditions for transitioning from the third state to the first state is that, while in the third state, there is no effective fail data in the intra-buffer memory 66 or that the amount of effective fail data in the first buffer section 40 is greater than a preset fourth threshold value ($B_2$), which is greater than the third threshold value ($B_1$). When the first state is transitioned to, the control section 50 stops the supply of the effective fail data buffered in the second buffer section 46 to the first buffer section 40, and writes the fail data and address data output from the testing section 20 to the first buffer section 40.

In this way, the control section 50 can return to a state in which the fail data and address data output from the testing section 20 are buffered in the first buffer section 40, and can decrease the amount of fail data and address data buffered in the second buffer section 46. Therefore, the control section 50 can shorten the process of transmitting the effective fail data in the second buffer section 46 to the first buffer section 40 after testing is finished.

After testing is finished and the output of fail data and address data from the testing section 20 is finished, if effective fail data remains in the second buffer section 46, the control section 50 transitions the fail analysis memory section 22 to the third state. In this way, the control section 50 can supply the first buffer section 40 with the effective fail data buffered in the second buffer section 46 after testing.

In the manner described above, after testing is finished, the fail analysis memory section 22 can transmit all of the effective fail data buffered in the second buffer section 46 to the first buffer section 40. As a result, the fail analysis memory section 22 can store all of the fail data output from the testing section 20 in the address fail memory section 42.

In the manner described above, with the test apparatus 10 of the present embodiment, even when testing the memory under test 200 at high speed, the fail data can be written to the address fail memory section 42 as long as an overflow does not occur due to insufficient capacity in the intra-buffer memory 66. With the test apparatus 10, speed can be increased without providing a plurality of address fail memory sections 42 and performing an interleaved operation, and therefore the fail analysis memory section 22 can be made smaller and less expensive.

Figure 7:
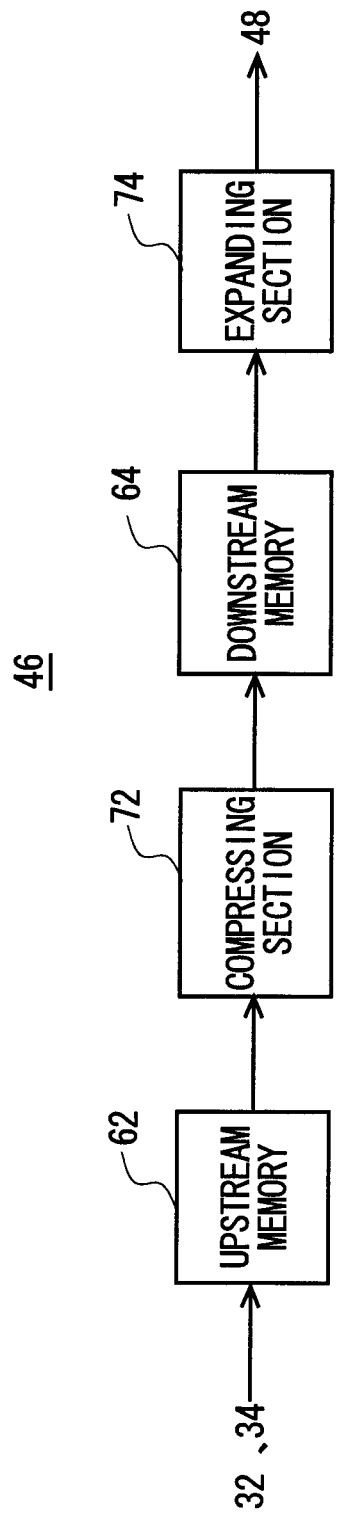
FIG. 7 shows a configuration of the second buffer section 46 according to a first modification of the present embodiment.

FIG. 7 shows a configuration of the second buffer section 46 according to a first modification of the present embodiment. The second buffer section 46 shown in FIG. 7 is a modification of the second buffer section 46 described in reference to FIGS. 1 to 6, and therefore components having the same function and configuration are given the same reference numerals and the following description includes only differing points.

The second buffer section 46 of the present modification includes the upstream memory section 62, a compressing section 72, the downstream memory section 64, and an expanding section 74. The compressing section 72 compresses the data (fail data and address data) to be written to the downstream memory section 64, using a preset compression algorithm.

For example, the compressing section 72 may be provided between the upstream memory section 62 and the downstream memory section 64 to compress the data output from the upstream memory section 62. Instead, the compressing section 72 may be provided upstream from the upstream memory section 62 to compress the data to be input to the upstream memory section 62.

The expanding section 74 expands the data read from the downstream memory section 64 using an expansion algorithm corresponding to the compression algorithm. In this way, the second buffer section 46 of the present modification can increase the amount of data (fail data and address data) that can be stored in the downstream memory section 64. Furthermore, increasing the amount of data that can be stored in the downstream memory section 64 also increases the amount of fail data written by the burst write operation per unit time.

Figure 8:
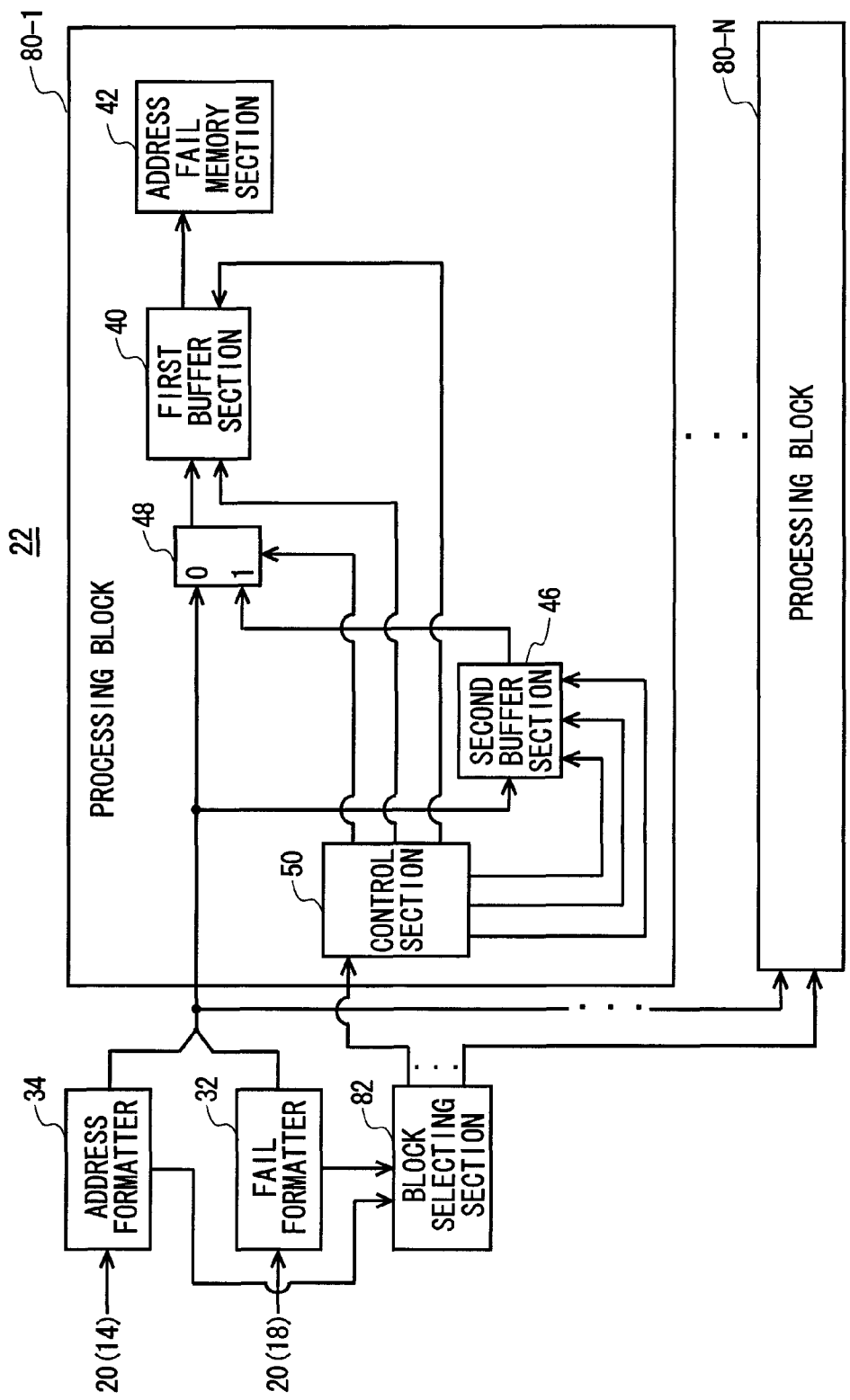
FIG. 8 shows a configuration of the fail analysis memory section 22 according to a second modification of the present embodiment.

FIG. 8 shows a configuration of the fail analysis memory section 22 according to a second modification of the present embodiment. The fail analysis memory section 22 according to the present modification shown in FIG. 8 adopts substantially the same function and configuration as the fail analysis memory section 22 described in relation to FIGS. 1 to 7, and therefore components of this fail analysis memory section 22 that have the same function and configuration as components of the fail analysis memory section 22 of the present embodiment are given the same reference numerals and the following description includes only differing points.

The fail analysis memory section 22 of the present modification includes a fail formatter 32, an address formatter 34, a plurality of processing blocks 80, and a block selecting section 82.

The fail formatter 32 supplies fail data with a converted format to each of the processing blocks 80. The address formatter 34 supplies address data with a converted format to each of the processing blocks 80. The address formatter 34 also outputs addresses for selecting among the plurality of processing blocks 80. The block selecting section 82 decodes the address selected by the address formatter 34 to select one block among the plurality of processing blocks 80 to which fail data is to be written.

The processing blocks 80 correspond respectively to partial regions obtained by dividing the address space of the memory under test 200. For example, if the address space of the memory under test 200 is divided in half, the fail analysis memory section 22 includes two processing blocks 80. When the address space of the memory under test 200 is divided in to N regions, where N is an integer greater than or equal to 2, the fail analysis memory section 22 includes N processing blocks 80-1 to 80-N.

The processing blocks 80 may each correspond to values of a predetermined number of bits (e.g. 1 bit, 2 bits, etc.) from the least significant bit in each address of the memory under test 200. For example, the processing blocks 80 may each correspond to the value of the least significant bit of each address of the memory under test 200 (in other words, each processing block 80 may correspond to even-numbered addresses or odd-numbered addresses). In this case, N=2, and therefore the fail analysis memory section 22 includes two processing blocks 80. Furthermore, when the processing blocks 80 each correspond to the value of two bits from the least significant bit of each address, N=4, and therefore the fail analysis memory section 22 includes four processing blocks 80.

Each time fail data is output from the testing section 20, e.g. each time a FLEX signal is output from the fail formatter 32, the block selecting section 82 decodes the processing block selection address output from the address formatter 34 when the fail data is output from the testing section 20, and selects the processing block 80 for which the fail data write process is to be performed. In this way, the block selecting section 82 can select one processing block 80, from among the plurality of processing blocks 80, corresponding to the partial region that includes the cell that is indicated to be defective by the fail data output from the testing section 20.

Each processing block 80 includes a first buffer section 40, an address fail memory section 42, a second buffer section 46, a switching section 48, and a control section 50. The internal memory 60 in the address fail memory section 42 of each processing block 80 includes an address space corresponding to the partial region corresponding to the processing block 80.

Each processing block 80 receives the fail data and address data output from the testing section 20, in response to the processing block 80 being selected. More specifically, the control section 50 of each processing block 80 causes the fail data and address data output from the fail formatter 32 and the address formatter 34 to be buffered in the first buffer section 40 or the second buffer section 46, in response to the processing block 80 being selected.

Each processing block 80 performs the same process as the fail analysis memory section 22 described in FIGS. 1 to 7, for the received fail data and address data. As a result, each processing block 80 can store data indicating whether each cell at each address in the corresponding partial region of the memory under test 200 is defective.

The fail analysis memory section 22 according to the present modification selects one processing block 80 among the plurality of processing blocks 80 and stores fail data in the address fail memory section 42 of the one selected processing block 80. Accordingly, when the testing section 20 outputs data (fail data and address data) at high speed, the fail analysis memory section 22 of the present modification can decrease the average rate of the data input to each processing block 80. Furthermore, with the fail analysis memory section 22 of the present modification, the address fail memory section 42 in each processing block 80 can perform the data writing process in parallel. Therefore, the fail analysis memory section 22 of the present modification can increase the rate of acquiring data directly with the first buffer section 40 without passing through the second buffer section 46, and can therefore lower the chances of the intra-buffer memory 66 overflowing.

Furthermore, in a conventional test apparatus that includes an interleaving fail analysis memory section, the fail data sequentially output from the logical comparator is divided according to time, and is therefore scattered and stored among a plurality of AFMs. Accordingly, with such a test apparatus, each AFM must have a capacity equivalent to that of the memory under test. In other words, when the test apparatus includes N AFMs that perform interleaved operation, memory with a capacity N times that of the memory under test must be provided.

In contrast, with the fail analysis memory section 22 of the present modification, although there is a chance that an overflow could occur depending on the capacity of the intra-buffer memories 66 in the processing blocks 80, the occurrence of an overflow would indicate that the memory under test has a large number of defective cells and would still be a defective article even if a repair analysis were performed, and therefore this overflow is not actually a problem. Furthermore, with the fail analysis memory section 22 of the present modification, each processing block 80 is configured to decrease the chances of an overflow therein, and address fail memory sections 42 can be provided with capacities corresponding to the partial regions of the memory under test 200. In other words, the total capacity of the internal memories 60 in the address fail memory sections 42 of the processing blocks 80 is the same as the capacity of the memory under test 200. Accordingly, the fail analysis memory section 22 of the present modification can use a lower total memory capacity for the address fail memory and therefore achieve a lower cost, compared to a conventional test apparatus that includes a fail analysis memory section using an interleaving operation.

Yet further, with the fail analysis memory section 22 of the present modification, each address fail memory section 42 writes the fail data in parallel using a read-modify-write process. Accordingly, the fail analysis memory section 22 of the present modification can increase the amount of fail data writing to the address fail memory sections 42 that can be completed during testing of the memory under test 200. Therefore, the fail analysis memory section 22 of the present modification can decrease the amount of data remaining in the second buffer sections 46 when testing by the testing section 20 is finished, thereby decreasing the time needed to finish writing of the fail data after testing is completed.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus comprising:
    a testing section operable to output a fail indication indicating a cell of a memory under test to be defective and a cell address;
    a first buffer section operable to buffer the fail indication and the cell address;
    a second buffer section operable to buffer the fail indication and the cell address;
    an address fail memory section operable to write the fail indication buffered by the first buffer section to an internal memory address indicated by the cell address using a read-modify-write process;
    a switching section operable to switch between supplying the fail indication and the cell address output from the testing section, and the fail indication and the cell address buffered in the second buffer section to the first buffer section; and
    a control section operable to supply the fail indication and the cell address output from the testing section to the second buffer section when an unused capacity of the first buffer section becomes less than or equal to a predetermined first threshold value.

2. The test apparatus according to claim 1, wherein when the fail indication and the cell address output from the testing section are supplied to the second buffer section, and the unused capacity of the first buffer section becomes greater than a second threshold value that is greater than or equal to the first threshold value, the control section supplies the fail indication and the cell address output from the testing section to the first buffer section instead of the second buffer section.

3. The test apparatus according to claim 1, wherein when the testing section begins outputting the fail indication and the cell address, the control section supplies the fail indication and the cell address output from the testing section to the first buffer section.

4. The test apparatus according to claim 1, wherein when the fail indication and the cell address output from the testing section are supplied to the first buffer section, and there is at least one unread fail indication and at least one unread cell address buffered in the second buffer section and an amount of unread data buffered in the first buffer section is less than or equal to a third threshold value, the control section supplies the unread fail indication and the unread cell address buffered in the second buffer section to the first buffer section and supplies the fail indication and the cell address output from the testing section to the second buffer section.

5. The test apparatus according to claim 4, wherein when the fail indication and the cell address output from the testing section are supplied to the second buffer section and the fail indication and the cell address buffered in the second buffer section are read and supplied to the first buffer section, and there is no unread fail indication or unread cell address buffered in the second buffer section, or when the amount of unread data buffered in the first buffer section is greater than a fourth threshold value that is greater than the third threshold value, the control section supplies the fail indication and the cell address output from the testing section to the first buffer section instead of supplying the fail indication and the cell address output from the testing section to the second buffer section, reading the fail indication and the cell address buffered in the second buffer section and supplying the fail indication and the cell address read from the second buffer section to the first buffer section.

6. The test apparatus according to claim 1, wherein after the testing section finishes outputting the fail indication and the cell address, the control section supplies the fail indication and the cell address buffered in the second buffer section to the first buffer section.

7. The test apparatus according to claim 1, wherein the first buffer section is a FIFO memory.

8. The test apparatus according to claim 7, wherein the second buffer section includes an upstream memory section including a FIFO memory buffering the fail indication and the cell address output from the testing section, and a downstream memory section including an intra-buffer memory, which is a random access memory, operable to
    sequentially receive the fail indication and the cell address buffered by the upstream memory section, and
    write the received fail indication and the received cell address to the intra-buffer memory using a burst write process.

9. The test apparatus according to claim 8, wherein the downstream memory section sequentially receives the fail indication and the cell address buffered in the upstream memory section and writes the received fail indication and the received cell address to the intra-buffer memory without using a read-modify-write process.

10. The test apparatus according to claim 8, wherein the second buffer section further includes a compressing section operable to compress data to be written to the downstream memory section, and an expanding section operable to expand data read from the downstream memory section.

11. The test apparatus according to claim 1, wherein when the second buffer section overflows, the control section sets an overflow flag in a register.

12. The test apparatus according to claim 1, further comprising:
    a plurality of processing blocks corresponding respectively to a plurality of partial regions obtained by dividing an address space of the memory under test; and
    a block selecting section operable to select a processing block, from among the plurality of processing blocks, corresponding to a partial region including a cell indicated to be defective by the fail indication output from the testing section, wherein each processing block includes a substantially similar first buffer section, a substantially similar second buffer section, a substantially similar control section, a substantially similar address fail memory section, and a substantially similar the switching section, and each processing block receives the fail indication and the cell address output from the testing section in response to being selected.

13. The test apparatus according to claim 12, wherein the internal memory included in the address fail memory section of each processing block has an address space corresponding to the partial region corresponding to the processing block.

14. An apparatus comprising:
a first buffer section operable to buffer a fail indication and a cell address from a testing section, the fail indication indicating that a cell of a memory under test is defective;
a second buffer section operable to buffer the fail indication and the cell address;
an address fail memory section operable to write the fail indication buffered by the first buffer section to an internal memory address indicated by the cell address using a read-modify-write process;
a switching section operable to switch between supplying the fail indication and the cell address output from the testing section, and the fail indication and the cell address buffered in the second buffer section to the first buffer section; and
a control section operable to supply the fail indication and the cell address output from the testing section to the second buffer section when an unused capacity of the first buffer section becomes less than or equal to a predetermined first threshold value.

15. A method comprising:
buffering, by a first buffer section, a fail indication and a cell address from a testing section, the fail indication indicating that a cell of a memory under test is defective;
buffering, by a second buffer section, the fail indication and the cell address;
writing, by an address fail memory section, the fail indication buffered by the first buffer section to an internal memory address indicated by the cell address using a read-modify-write process;
switching, by a switching section, between supplying the fail indication and the cell address output from the testing section, and the fail indication and the cell address buffered in the second buffer section to the first buffer section; and
supplying, by a control section, the fail indication and the cell address output from the testing section to the second buffer section when an unused capacity of the first buffer section becomes less than or equal to a predetermined first threshold value.

* * * * *